(12) United States Patent
Fuderer

(10) Patent No.: US 8,072,215 B2
(45) Date of Patent: Dec. 6, 2011

(54) MAGNETIC RESONANCE DEVICE AND METHOD

(75) Inventor: Miha Fuderer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 438 days.

(21) Appl. No.: 12/307,618

(22) PCT Filed: Jul. 4, 2007

(86) PCT No.: PCT/IB2007/052608
§ 371 (c)(1),
(2), (4) Date: Jan. 6, 2009

(87) PCT Pub. No.: WO2008/004192
PCT Pub. Date: Jan. 10, 2008

(65) Prior Publication Data
US 2009/0292197 A1    Nov. 26, 2009

(30) Foreign Application Priority Data

Jul. 6, 2006 (EP) ..................................... 06116720

(51) Int. Cl.
*G01V 3/00* (2006.01)
(52) U.S. Cl. ...................................... 324/318; 324/309
(58) Field of Classification Search .......... 324/300–322; 600/407–445
See application file for complete search history.

(56) References Cited

U.S. PATENT DOCUMENTS

| | | | | |
|---|---|---|---|---|
| 5,270,654 A | | 12/1993 | Feinberg et al. | |
| 5,327,088 A | * | 7/1994 | Pipe | 324/309 |
| 5,561,370 A | * | 10/1996 | Fuderer | 324/309 |
| 6,275,037 B1 | | 8/2001 | Harvey et al. | |
| 6,650,925 B2 | * | 11/2003 | Wang | 600/410 |
| 7,397,242 B2 | * | 7/2008 | Samsonov et al. | 324/309 |
| 7,741,846 B2 | * | 6/2010 | Jurrissen et al. | 324/318 |
| 7,843,195 B2 | * | 11/2010 | Ruhm | 324/309 |
| 2004/0189299 A1 | | 9/2004 | Ikezaki | |

FOREIGN PATENT DOCUMENTS

| | | |
|---|---|---|
| EP | 0644437 A1 | 3/1995 |
| WO | 2004031793 A1 | 4/2004 |

(Continued)

OTHER PUBLICATIONS

Chen, N., et al.; Single-Shot and Segmented EPI Ghost Artifacts Removal with Two-Dimensional Phase Correction; 2000; Proc. Intl. Soc. Mag. Reson. Med.; 8:1713.

(Continued)

*Primary Examiner* — Brij Shrivastav

(57) ABSTRACT

MR imaging of a body (7) placed in an examination volume includes establishing a substantially homogeneous main magnetic field in the examination volume, generating switched magnetic field gradients superimposed upon the main magnetic field, radiating RF pulses towards the body (7), controlling the generation of the magnetic field gradients and the RF pulses, receiving and sampling MR signals, and forming MR images from the signal samples. A sequence of MR echo signals is generated by subjecting at least a portion of the body (7) to a single RF pulse and a plurality of switched magnetic field gradients. The switched magnetic field gradients are controlled to produce at least two sub-sequences of MR echo signals. Each sub-sequence traverses a different trajectory in k-space with subsampling in the phase encoding direction ($k_y$) MR echo signals are acquired and sampled. An MR image is reconstructed from the signal samples and from phase/amplitude correction maps associated with the sub-sequences of MR echo signals.

14 Claims, 2 Drawing Sheets

OTHER PUBLICATIONS

Kuhara, S., et al.; A Novel EPI Reconstruction Technique using Multiple RF Coil Sensitivity Maps; 2000; Int. Soc. Mag. Reson. Med.; 8:154.

McKinnon, G. C.; Ultrafast Interleaved Gradient-Echo-Planar Imaging on a Standard Scanner; 1993; MRM; 30(5) 609-616.

Pruessmann, K. P., et al.; Sense: Sensitivity Encoding for Fast MRI; 1999; MRM; 42:952-962.

Singh, M., et al.; Iterative Estimation of T2 to Correct Echo Planar Magnetic Resonance Images; 1990; IEEE Trans. on Nuclear Science; 37(2)795-799.

Song, A. W.; Single-Shot EPI with Signal Recovery from the Susceptibility-Induced Losses; 2001; MRM; 46:407-411.

Weiskopf, N., et al.; Single-Shot compensation of image distortions and BOLD contrast optimization using multi-echo EPI for real-time fMRI; 2005; Neuroimage; 24(4)1068-1079.

* cited by examiner

MAGNETIC RESONANCE DEVICE AND METHOD

FIELD OF THE INVENTION

The present invention relates to the field of magnetic resonance (MR). It finds particular application in conjunction with MR imaging methods and MR scanners for diagnostic purposes in medicine.

BACKGROUND OF THE INVENTION

In MR imaging, pulse sequences consisting of RF pulses and switched magnetic field gradients are applied to an object (a patient) to generate magnetic resonance signals, which are scanned in order to obtain information therefrom and to reconstruct images of the object. Since its initial development, the number of clinical relevant fields of application of MRI has grown enormously. MRI can be applied to almost every part of the body, and it can be used to obtain information about a number of important functions of the human body. The pulse sequence which is applied during an MRI scan determines completely the characteristics of the reconstructed images, such as location and orientation of the image slice in the object, dimensions, resolution, signal-to-noise ratio, contrast, sensitivity for movements, etcetera. An operator of a MRI device has to choose the appropriate sequence and has to adjust and optimize its parameters for the respective application.

There are several applications in MR imaging that require the acquisition of a whole slice within the examined body in one single shot. In that case, usually EPI (Echo Planar Imaging) is the method of choice. EPI typically uses an initial spatially selective 90° RF pulse to excite the nuclear magnetization within the image slice of interest. The initial pulse generates an echo signal which is thereafter repetitively refocused by read-out magnetic field gradients of quickly alternating polarity to form a train of multiple gradient echoes. Each of these gradient echoes is typically differently phase encoded by additional small gradient pulses occurring between the echoes. While an EPI sequence can collect a full MR image data set in a very short time (e.g., tens of milliseconds), it requires comparatively high performance hardware of the used MR device. For high field MR imaging, EPI is particularly interesting because it is very efficient in terms of received signal power over transmitted RF power (SAR). Unfortunately, EPI is susceptible to significant image distortion due to main magnetic field inhomogeneity, $T_2$ relaxation, and chemical shift effects that evolve over the relatively long duration of the echo train. This is a particularly serious drawback of EPI in cases in which it is desired to achieve high image resolution. The reason is that an increase of image resolution always implies a corresponding increase of the duration of the EPI echo train.

It is well known that the afore-mentioned problems and drawbacks of the EPI sequence can be resolved by the incorporation of additional RF pulses into the imaging sequence. Such methods are known as multi-shot EPI or GRASE, as it is described, e.g., in the document U.S. Pat. No. 5,270,654. The main disadvantage of these known techniques is their much higher RF energy deposition (SAR), which can easily exceed presently acceptable safety limits for the human body.

SUMMARY OF THE INVENTION

Therefore, it is readily appreciated that there is a need for an improved MR device and method. It is consequently the primary object of the present invention to provide a technique, which enables high-resolution MR imaging with a minimum of transmitted RF power.

In accordance with the present invention, a device for MR imaging of a body placed in an examination volume is disclosed, which comprises
   means for establishing a substantially homogeneous main magnetic field in the examination volume,
   means for generating switched magnetic field gradients superimposed upon the main magnetic field,
   means for radiating RF pulses towards the body,
   control means for controlling the generation of the magnetic field gradients and the RF pulses,
   means for receiving and sampling MR signals, and
   reconstruction means for forming MR images from the signal samples. The device of the invention is characterized in that it is arranged to
   a) generate a sequence of MR echo signals by subjecting at least a portion of the body to a single RF pulse and a plurality of switched magnetic field gradients, the switched magnetic field gradients being controlled to produce at least two sub-sequences of MR echo signals, wherein each sub-sequence traverses a different trajectory in k-space with subsampling in the phase encoding direction;
   b) acquire and sample the MR echo signals;
   c) reconstruct an MR image from the signal samples and from phase/amplitude correction maps associated with the sub-sequences of MR echo signals.

In accordance with one aspect, the k-space trajectory of the applied MR imaging pulse sequence is subdivided into two or more k-space passes. Because of the subsampling in the phase encoding direction, the progress of the k-space trajectory in this direction is faster than in the conventional EPI sequence. In order to fully cover k-space, two or more sub-sequences of MR echo signals are produced. During each k-space pass, a different trajectory in k-space is traversed. For image reconstruction, the signal samples of the sub-sequences of MR echo signals are initially regarded as distinct signal data sets. Individual MR images reconstructed from these data sets contain strong artefacts that are due to the subsampling in the phase encoding direction and also to T2 decay, magnetic field inhomogeneity, and chemical shift effects. These artefacts are removed by combining the distinct signal data sets and by using phase/amplitude correction maps associated with the sub-sequences of MR echo signals. The phase/amplitude correction maps contain a-priori knowledge regarding the T2 decay, magnetic field inhomogeneity, and chemical shift effects that evolve over the time period of the signal acquisition. The encoding of the acquired magnetic resonance signals that is achieved by the mentioned effects is made use of according to the invention in order to considerably accelerate the progression of the k-space trajectory in the phase encoding direction. In this way, high-resolution single-shot imaging is enabled in which all image distortions that are due to T2, field inhomogeneity, chemical shift and similar effects are efficiently compensated for. Because only a single RF pulse is needed, the SAR of the imaging procedure of the invention is minimal.

In the known so-called SENSE technique (see for example Pruessmann et al, Magnetic Resonance in Medicine, volume 42, page 952, 1999), magnetic resonance signals are acquired in a subsampled fashion while using multiple receiving coils of a magnetic resonance device. The phase encoding steps in the k-space are increased relative to the phase encoding steps actually required for the complete predetermined field of view in geometrical space. This subsampling results in a reduced field of view. In conformity with the SENSE technique, images are reconstructed from the subsampled data separately for each receiving coil. Because of the subsampling, these intermediary images contain fold-over or so-called aliasing phenomena. On the basis of the known spatial sensitivity profiles of the receiving coils, the individual contributions to the folded-over image values of the intermediate images can be decomposed (unfolded) by means of matrix computations into image values at spatial positions within the full field of view. In this way, the spatial encoding of the acquired magnetic resonance signals by the spatial sensitivity profiles of the receiving coils is made use of in order to accelerate the image acquisition procedure. When the known SENSE technique is employed for the computation of the final image of the complete field of view, the ratio of the dimensions of the full field of view relative to the reduced field is also referred to as reduction factor or simply as SENSE factor.

The invention proposes to combine the sampled echo signals associated with the different k-space passes in a SENSE-like manner during image reconstruction. In accordance with the invention, a-priori knowledge on $T_2$, field inhomogeneity, chemical shift and similar effects is used (rather than a-priori knowledge on coil sensitivity profiles) for the removal of image artefacts.

In practice, the magnetic field gradients are controlled in accordance with the invention such that the k-space trajectory of each sub-sequence of MR echo signals is interleaved with the trajectories of the other sub-sequences. This is the most straightforward method to completely cover k-space in the phase encoding direction during signal acquisition. The interleaved scheme also helps to improve the numerical stability of the result of the image reconstruction from the signal samples and from the phase/amplitude correction maps.

The imaging technique of the invention can advantageously be combined with the above-described conventional SENSE method. For this purpose, the MR device of the invention may comprise two or more receiving antennas for receiving the MR echo signals from the body, which receiving antennas have different sensitivity profiles. In this case, the MR device is further arranged to reconstruct the MR image from the signal samples and from the phase/amplitude correction maps associated with the sub-sequences of MR echo signals and also from the sensitivity profiles of the receiving antennas. An additional subsampling may be applied in the phase encoding direction in order to further increase imaging speed. In this case, k-space is incompletely sampled by the entirety of sub-sequences of MR echo signals while using multiple receiving antennas for signal acquisition.

In a practical embodiment of the invention, the phase/amplitude correction maps (and—if applicable—the sensitivity profiles of the receiving antennas) that are required for image reconstruction are determined by means of a reference measurement being carried out with reduced spatial resolution. The imaging sequence of RF pulses and switched magnetic field gradients of the reference scan should resemble the imaging sequence that is used for the actual image acquisition in order to make sure that the phase and amplitude distortions due to $T_2$, field inhomogeneity, and chemical shift are the same. But the reference scan has to be carried out without subsampling, i.e., with reduced speed of progression in the phase encoding direction of k-space. In this case, it can be made sure that the reference images reconstructed from the individual sub-sequences of MR echo signals are free of subsampling artefacts (aliasing). The resulting reduced resolution of the reference measurement suffices for the determination of the position dependent phase and amplitude correction values.

The invention not only relates to a device but also to a method for magnetic resonance imaging of at least a portion of a body placed in an examination volume of an MR device. The method comprises the following steps:

a) generation of a sequence of MR echo signals by subjecting at least a portion of the body to a single RF pulse and a plurality of switched magnetic field gradients, the switched magnetic field gradients being controlled to produce at least two sub-sequences of MR echo signals, wherein each sub-sequence traverses a different trajectory in k-space with sub-sampling in the phase encoding direction;

b) acquisition and sampling of the MR echo signals;

c) reconstruction of an MR image from the signal samples and from phase/amplitude correction maps associated with the sub-sequences of MR echo signals.

A computer program with instructions for carrying out the MR procedure of the invention can advantageously be implemented on any common computer hardware, which is presently in clinical use for the control of magnetic resonance scanners. The computer program can be provided on suitable data carriers, such as CD-ROM or diskette. Alternatively, it can also be downloaded by a user from an Internet server.

The following drawings disclose preferred embodiments of the present invention. It should be understood, however, that the drawings are designed for the purpose of illustration only and not as a definition of the limits of the invention.

DETAILED DESCRIPTION

Figure 1A:
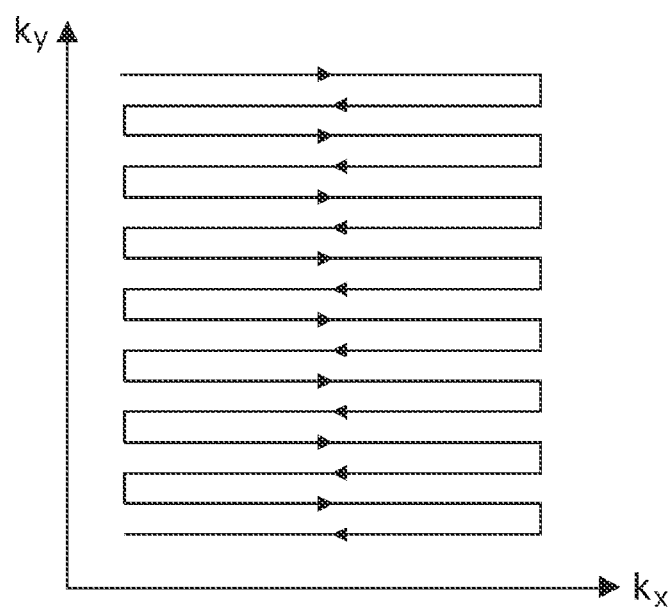
FIG. 1a shows a diagram of the k-space sampling scheme of a conventional EPI imaging sequence.
Figure 1B:
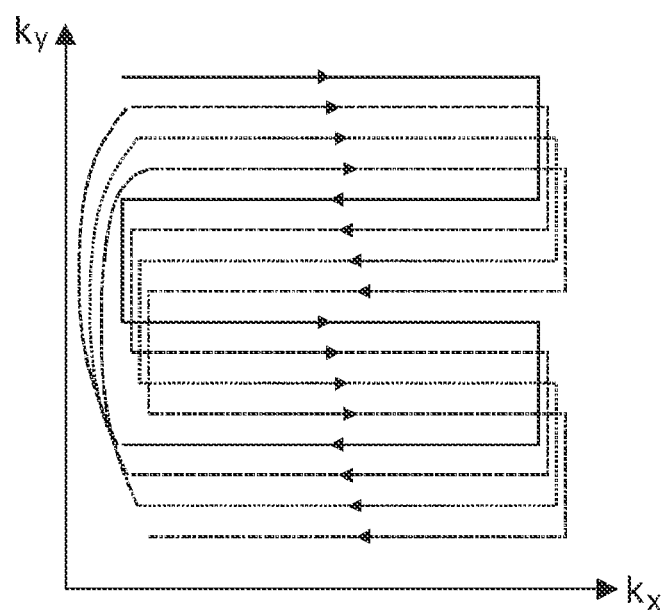
FIG. 1b shows a diagram of the k-space sampling scheme according to the invention.

Conventionally, an EPI sequence traverses k-space as shown in FIG. 1a. The zig-zagging k-space trajectory of the generated and acquired MR echo signals is progressing comparatively slowly in the phase encoding direction $k_y$. The invention proposes a faster progression in k-space by taking larger $k_y$ steps, as can be seen in FIG. 1b. In order to fully cover k-space, four separate sub-sequences of MR echo signals are generated in accordance with the shown embodiment. Their k-space trajectories are depicted in FIG. 1b by solid, dashed, dotted, and dashed/dotted lines, respectively. Each sub-sequence traverses a different trajectory in k-space. It is evident that the overall scanning time to acquire and sample MR signals along the complete trajectory shown in FIG. 1b is substantially equal to the time required according to the conventional scheme shown in FIG. 1a. Yet, in the embodiment of FIG. 1b, k-space is traversed four times faster in the phase encoding direction by a single sub-sequence of MR echoes, thereby reducing all distortions (such as, e.g., chemical shift effects) by a factor of four. Of course, one single (subsampled) passage through k-space is not sufficient for image reconstruction. In order to cover k-space completely, the trajectory goes back in k-space after each pass and another pass starts from a position in k-space that is slightly offset with respect to the last starting position. As a result, the k-space trajectory of each sub-sequence of MR echo signals is interleaved with the trajectories of the other sub-sequences so as to completely sample k-space in the phase encoding direction. If k-space would simply be filled in the manner shown in FIG. 1b, an image reconstructed by Fourier transformation of this data set would be completely deteriorated by different kinds of image artefacts. The reason for this is that there is a significant (phase and amplitude) modulation of the acquired signal which is due to $T_2$ decay, chemical shift evolving during acquisition time, and main magnetic field inhomogeneities. In accordance with the invention, a specific image reconstruction scheme is required in order to compensate for these disturbing effects. The MR signal data acquired and sampled from the four k-space passes are initially regarded as eight distinct subsets of lines in k-space: the forwards directed first pass, the backwards directed second pass, the forwards directed second pass, and so on. Each of these subsets is an eight-fold subsampled signal data set. There are eight of such subsampled data sets which are reconstructed in a SENSE-like manner according to the invention. Unlike conventional SENSE, the subsets do not differ in spatial coil sensitivity but in phase and amplitude being determined by a position-dependent phase shift induced by chemical shift effects, a position-dependent phase shift induced by magnetic field inhomogeneities, a position-dependent amplitude variation induced by $T_2$ relaxation, and an intended dephasing due to the fact that the different passes do not co-incide in $k_y$. Like in SENSE, the reconstruction procedure requires knowledge on these position dependencies. In accordance with the invention, the phase and amplitude distortions are taken into account by reconstructing the final MR image from the subsets of the signal samples and from phase/amplitude correction maps containing the relevant a-priori knowledge of the relevant effects and their position dependencies. The phase/amplitude maps can easily be obtained by means of a corresponding reference measurement. The k-space trajectory of the reference measurement should resemble the actual image acquisition scheme but with a reduced speed of progression in the phase encoding direction in order to avoid subsampling. The resulting reduced resolution of the reference measurement suffices for the determination of the phase/amplitude correction maps.

The k-space lines of the scheme shown in FIG. 1b could be chosen slightly denser than required theoretically in accordance with Nyquist's theorem. This would increase the total acquisition time, but the numerical stability of the image reconstruction would be improved. An additional improvement is to employ slightly different echo delay times of the EPI sequence between subsequent passes, as it can be seen FIG. 1b, in order to avoid singularities in the set of linear equations that has to be solved according to the SENSE algorithm.

Figure 2:
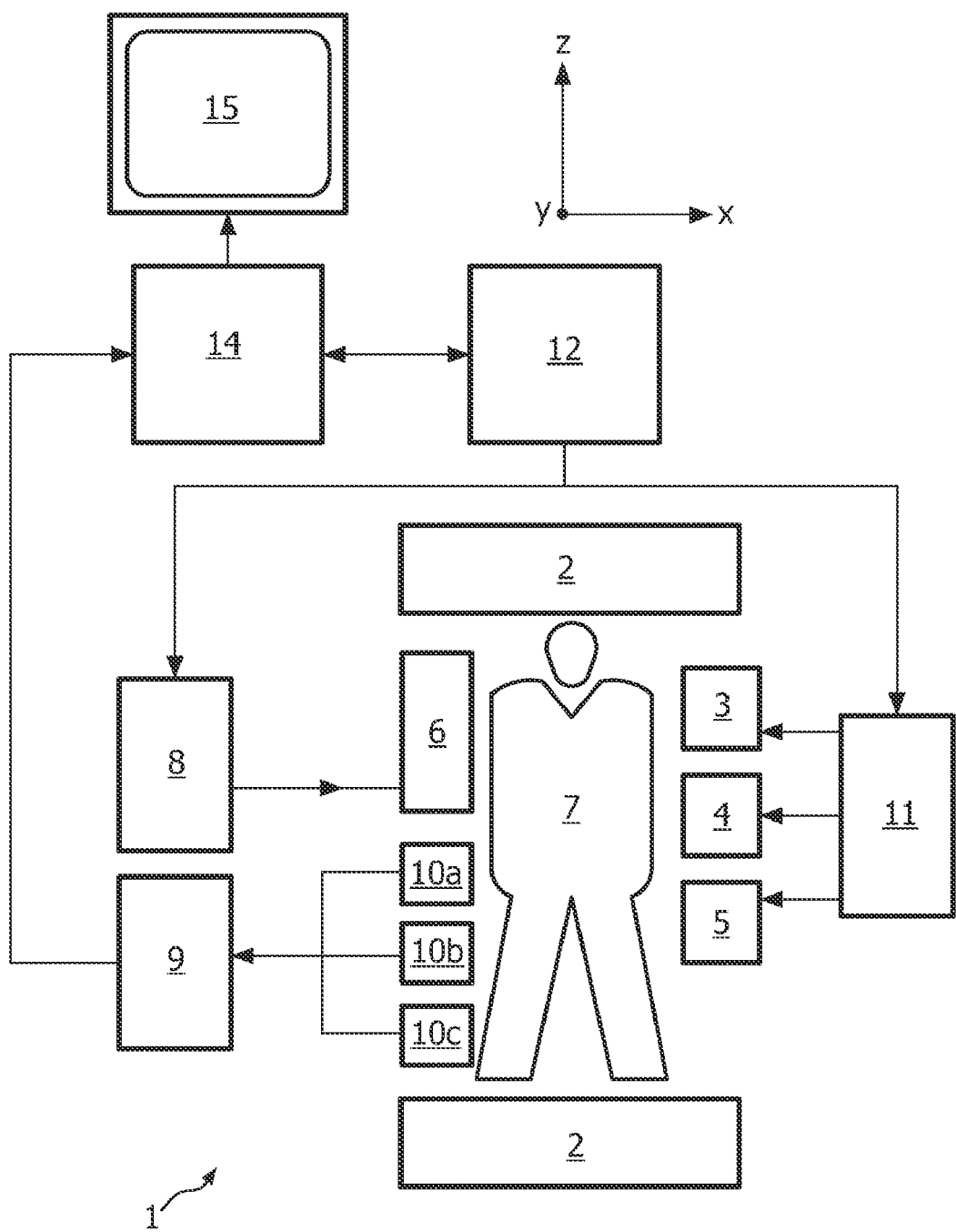
FIG. 2 shows an embodiment of an MRI scanner according to the invention.

In FIG. 2 a magnetic resonance imaging device 1 in accordance with the present invention is shown as a block diagram. The apparatus 1 comprises a set of main magnetic coils 2 for generating a stationary and homogeneous main magnetic field and three sets of gradient coils 3, 4 and 5 for superimposing additional magnetic fields with controllable strength and having a gradient in a selected direction. Conventionally, the direction of the main magnetic field is labelled the z-direction, the two directions perpendicular thereto the x- and y-directions. The gradient coils are energized via a power supply 11. The apparatus 1 further comprises a radiation emitter 6, an antenna or coil, for emitting radio frequency (RF) pulses to a body 7, the radiation emitter 6 being coupled to a modulator 8 for generating and modulating the RF pulses. Also provided are receiving antennas 10a, 10b, 10c for receiving the MR signals, the receiving antennas can for example be separate surface coils with different spatial sensitivity profiles. The received MR signals are input to a demodulator 9. The modulator 8, the emitter 6 and the power supply 11 for the gradient coils 3, 4 and 5 are controlled by a control system 12 to generate the actual imaging sequence for MR imaging in accordance with the above-described invention. The control system is usually a microcomputer with a memory and a program control. For the practical implementation of the invention it comprises a programming with a description of an imaging procedure as described above. The demodulator 9 is coupled to a data processing unit 14, for example a computer, for transformation of the received magnetic resonance signals into an image in accordance with a combination of the method of the invention with the known SENSE unfolding algorithm. In this case, both the spatial sensitivity profiles of the antennas 10a, 10b, 10c and the phase/amplitude correction maps associated with the employed k-space sampling scheme would have to be taken into account. The final image can be made visible, for example, on a visual display unit 15.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A device for MR imaging of a body placed in an examination volume, the device comprising:
   a magnet which establishes a substantially homogeneous main magnetic field in the examination volume;
   gradient field magnets which superimpose magnetic field gradients upon the main magnetic field;
   an RF source which radiates RF pulses towards the body;
   a controller which controls the gradient field magnets and the RF source to generate an RF pulse followed by a plurality of switched magnetic field gradients, the switched magnetic field gradients being controlled to produce at least two sub-sequences of MR echo signals, each sub-sequence traversing a different trajectory in k-space with subsampling in a phase encoding direction;
   two or more receiving antennas for receiving the MR echo signals from the body, which receiving antennas have sensitivity profiles
   a reconstruction processor which reconstructs an MR image from the MR echo signals and from the phase/amplitude correction maps associated with sub-sequences of MR echo signals and from sensitivity profiles of the receiving antennas.

2. The device of claim 1, wherein the controller controls the magnetic field gradients such that the k-space trajectory of each sub-sequence of MR echo signals is interleaved with the trajectories of the other sub-sequences to completely sample k-space in the phase encoding direction.

3. The device of claim 1, wherein the MR echo signals are generated by means of a single-shot EPI (echo planar imaging) sequence comprising one RF pulse followed by a plurality of phase-encoding and read-out switched magnetic field gradients.

4. A device for MR imaging of a body placed in an examination volume, the device comprising:
   a magnet which establishes a substantially homogeneous main magnetic field in the examination volume;
   gradient magnets which superimpose magnetic field gradient pulses upon the main magnetic field;
   an RF source which radiates RF pulses towards the body;
   a controller which controls the gradient magnets and the RF source to generate an RF pulse followed by a plurality of switched magnetic field gradients, the switched magnetic field gradients being controlled to produce at least two subsequences of MR echo signals, wherein each sub-sequence traverses a different trajectory in k-space with subsampling in the phase encoding direction;

a receiver which receives and samples the MR echo signals; and a reconstruction unit which reconstructs an MR image from the MR echo signals and from phase/amplitude correction maps associated with the subsequences of MR echo signals, wherein the phase/amplitude correction maps comprise position dependent phase and amplitude correction factors determined by T2 relaxation and/or inhomogeneities of the main magnetic field and/or chemical shift of the imaged nuclear spin species and/or phase shift due to the k-space sampling scheme of the individual sub-sequences of MR echoes.

5. The device of claim 4, wherein an additional subsampling is applied in the phase encoding direction such that k-space is incompletely sampled by the entirety of sub-sequences of MR echo signals while using two or more receiving antennas for MR echo signal acquisition.

6. The device of claim 4, wherein the phase/amplitude correction maps are determined by a reference measurement carried out with reduced spatial resolution.

7. A method for MR imaging of at least a portion of a body placed in an examination volume of an MR device, the method comprising the following steps:
   a) generating a sequence of MR echo signals by subjecting at least a portion of the body to an RF pulse followed by a plurality of switched magnetic field gradients, each switched magnetic field gradient concurrently to produce at least two sub-sequences of MR echo signals, each sub-sequence of MR echo signals traversing a different trajectory in k-space with subsampling in a phase encoding direction;
   b) acquiring and sampling of the at least two subsequences of MR echo signals;
   c) reconstructing of an MR image from the acquired and sampled subsequences of MR echo signals and from phase/amplitude correction maps associated with the sub-sequence MR echo signals.

8. The method of claim 7, wherein the magnetic field gradients are controlled such that a k-space trajectory of each sub-sequence MR echo signal is interleaved with the k-space trajectories of the other sub-sequence MR echo signals to completely sample k-space in the phase encoding direction.

9. The method according to claim 7, wherein the subsequence MR echo signals are acquired using two or more receiving antennas having different sensitivity profiles.

10. The method according to claim 7, wherein the phase/amplitude correction maps include position dependent amplitude phase and correction factors based on a $T_2$ relaxation time and/or inhomogeneities of a main magnetic field and/or chemical shift of an imaged nuclear spin species and/or a phase shift due to a k-space sampling scheme.

11. A non-transitory computer-readable medium carrying software which controls one or more processors to perform the method of claim 7.

12. A magnetic resonance imaging device including:
   a main magnet which generates a main magnetic field;
   an RF source;
   gradient field magnets;
   an RF receiver;
   a reconstruction unit; and
   one or more processors programmed to control the magnetic gradient coils, the RF source, and the reconstruction processor to perform the method according to claim 7.

13. A magnetic resonance system comprising:
   a main magnet which generates a main magnetic field through an examination region;
   gradient magnetic field magnets which generate magnetic field gradients across the examination region;
   an RF source which radiates RF pulses into the examination region;
   at least two receive antennas which have different sensitivity profiles;
   at least one receiver connected with the at least two receive antennas;
   a controller which controls the gradient magnetic field magnet to apply an RF pulse followed by a plurality of switched magnetic field gradients to induce a plurality of magnetic resonance echo signals which are received by the at least two receive antennas; and
   a reconstruction processor which reconstructs the plurality of magnetic resonance echo signals using sensitivity profiles of the at least two receive antennas.

14. The magnetic resonance apparatus of claim 13, wherein the magnetic resonance echoes received by the at least two antenna produce at least two subsequences of MR echo signals which traverse different trajectories in k-space.

* * * * *